United States Patent
Patino Virano et al.

(10) Patent No.: US 11,514,383 B2
(45) Date of Patent: Nov. 29, 2022

(54) METHOD AND SYSTEM FOR INTEGRATED WELL CONSTRUCTION

(71) Applicant: Schlumberger Technology Corporation, Sugar Land, TX (US)

(72) Inventors: Diego Fernando Patino Virano, Katy, TX (US); Philip Christopher Temple, Houston, TX (US); Adam David Sallee, Katy, TX (US); Oswaldo Bustos Angel, Katy, TX (US); Steven Hann, Spring, TX (US); Velizar Vesselinov, Los Altos Hills, CA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 123 days.

(21) Appl. No.: 16/569,792

(22) Filed: Sep. 13, 2019

(65) Prior Publication Data

US 2021/0081857 A1    Mar. 18, 2021

(51) Int. Cl.
  *G06Q 10/06* (2012.01)
  *G06F 30/20* (2020.01)
  *E21B 44/00* (2006.01)
  *H04L 67/125* (2022.01)

(52) U.S. Cl.
  CPC ......... *G06Q 10/0635* (2013.01); *E21B 44/00* (2013.01); *G06F 30/20* (2020.01); *H04L 67/125* (2013.01)

(58) Field of Classification Search
  None
  See application file for complete search history.

(56) References Cited

U.S. PATENT DOCUMENTS

| | | | |
|---|---|---|---|
| 4,845,628 A | * | 7/1989 | Gray ................. E21B 44/00 702/9 |
| 6,639,331 B2 | | 10/2003 | Schultz |
| 6,892,812 B2 | | 5/2005 | Niedermayr et al. |
| 6,896,055 B2 | | 5/2005 | Koithan |
| 6,931,621 B2 | | 8/2005 | Green et al. |

(Continued)

FOREIGN PATENT DOCUMENTS

| | | |
|---|---|---|
| RU | 2457325 C2 | 7/2012 |
| RU | 2617817 C2 | 4/2017 |

(Continued)

OTHER PUBLICATIONS

Bello et al. "Application of Artificial Intelligence Methods in Drilling System Design and Operations: A Review of the State of the Art" (2015) (retrieved from https://sciendo.com/pdf/10.1515/jaiscr-2015-0024) (Year: 2015).*

(Continued)

*Primary Examiner* — Sujay Koneru
(74) *Attorney, Agent, or Firm* — Alec J. McGinn

(57) ABSTRACT

A method may include obtaining, by the computer processor, rig operation data regarding various drilling rigs at different geographic locations. The method may further include generating, using the rig operation data, a model that identifies a level of risk associated with various rig operations. The method may further include simulating, by the computer processor and using the geographic location data and the model, a sequence of rig operations for constructing a portion of a wellbore drilled by a drilling rig at the desired geographic location.

21 Claims, 7 Drawing Sheets

(56) References Cited

U.S. PATENT DOCUMENTS

| | | |
|---|---|---|
| 7,172,037 B2 | 2/2007 | Dashevskiy et al. |
| 7,193,162 B2 * | 3/2007 | McIsaac et al. .......... G01F 1/76 177/1 |
| 7,264,050 B2 | 9/2007 | Koithan et al. |
| 7,357,196 B2 | 4/2008 | Goldman et al. |
| 7,860,593 B2 | 12/2010 | Boone |
| 7,938,197 B2 | 5/2011 | Boone et al. |
| 8,121,971 B2 | 2/2012 | Edwards et al. |
| 8,215,417 B2 | 7/2012 | Annaiyappa et al. |
| 8,250,816 B2 | 8/2012 | Donnally et al. |
| 8,301,386 B1 | 10/2012 | Redmond et al. |
| 8,386,059 B2 | 2/2013 | Boone |
| 8,519,565 B2 | 8/2013 | Dozier et al. |
| 8,590,635 B2 | 11/2013 | Koederitz |
| 8,604,639 B2 | 12/2013 | Hopwood |
| 8,676,721 B2 | 3/2014 | Piovesan et al. |
| 9,240,687 B2 | 1/2016 | Carralero et al. |
| 9,322,247 B2 | 4/2016 | Rojas et al. |
| 9,347,288 B2 * | 5/2016 | Clemens .............. E21B 31/107 |
| 9,436,173 B2 | 9/2016 | Wang et al. |
| 9,506,336 B2 | 11/2016 | Orbell |
| 9,528,364 B2 | 12/2016 | Samuel et al. |
| 9,593,567 B2 | 3/2017 | Pink et al. |
| 9,598,947 B2 | 3/2017 | Wang et al. |
| 9,644,431 B2 | 5/2017 | Myers et al. |
| 9,803,461 B2 | 10/2017 | Boone |
| 9,806,530 B2 | 10/2017 | Martinez |
| 9,896,925 B2 | 2/2018 | Hernandez et al. |
| 9,933,919 B2 | 4/2018 | Raja et al. |
| 9,934,338 B2 | 4/2018 | Germain et al. |
| 9,934,479 B2 | 4/2018 | Sanchez et al. |
| 9,946,445 B2 | 4/2018 | Whalley |
| 10,017,993 B2 | 7/2018 | Hu et al. |
| 10,049,474 B2 | 8/2018 | Germain et al. |
| 10,067,973 B2 | 9/2018 | Moore |
| 10,119,380 B2 | 11/2018 | Joseph et al. |
| 10,138,722 B2 | 11/2018 | Magnuson |
| 10,151,178 B2 | 12/2018 | Stephenson et al. |
| 10,161,226 B2 | 12/2018 | Bagnaro |
| 10,198,159 B2 | 2/2019 | Ziegler et al. |
| 10,202,837 B2 | 2/2019 | Ng et al. |
| 10,209,400 B2 | 2/2019 | Bermudez Martinez et al. |
| 10,215,009 B2 | 2/2019 | Tjostheim et al. |
| 10,233,728 B2 | 3/2019 | Kristjansson et al. |
| 10,243,371 B2 | 3/2019 | Gerdes et al. |
| 10,260,332 B2 | 4/2019 | Israel et al. |
| 10,273,752 B2 | 4/2019 | Mebane, III |
| 10,294,770 B2 | 5/2019 | Anghelescu et al. |
| 10,301,923 B2 | 5/2019 | Andresen et al. |
| 10,309,166 B2 | 6/2019 | Thiemann et al. |
| 10,345,771 B2 | 7/2019 | Anno et al. |
| 10,390,466 B2 | 8/2019 | Held et al. |
| 10,392,918 B2 | 8/2019 | Harkless et al. |
| 10,472,953 B2 | 11/2019 | Orban |
| 2002/0103630 A1 * | 8/2002 | Aldred et al. .......... E21B 44/00 703/10 |
| 2005/0076965 A1 | 4/2005 | Buckner |
| 2005/0216196 A1 * | 9/2005 | Akkurt et al. ........ G01N 24/081 702/6 |
| 2008/0262810 A1 * | 10/2008 | Moran ................... E21B 44/00 703/10 |
| 2008/0289877 A1 * | 11/2008 | Nikolakis-Mouchas .................... E21B 44/00 175/57 |
| 2009/0194273 A1 | 8/2009 | Surjaatmadja et al. |
| 2011/0161133 A1 * | 6/2011 | Staveley et al. ..... G06Q 10/063 705/7.28 |
| 2012/0024605 A1 * | 2/2012 | Elinas ................... G06Q 10/06 175/57 |
| 2013/0066471 A1 * | 3/2013 | Wang ................... G05B 13/024 700/275 |
| 2013/0140031 A1 * | 6/2013 | Cohen ................... E21B 43/26 166/308.1 |
| 2013/0341093 A1 * | 12/2013 | Jardine ................. E21B 44/00 175/40 |
| 2014/0116776 A1 * | 5/2014 | Marx .................... E21B 47/00 175/24 |
| 2014/0166361 A1 * | 6/2014 | Jamison et al. ........ G01N 21/31 175/24 |
| 2014/0214387 A1 * | 7/2014 | Tilke .................... E21B 43/305 703/10 |
| 2014/0277752 A1 * | 9/2014 | Chang et al. .......... E21B 44/00 700/275 |
| 2015/0241871 A1 | 8/2015 | Yoshino et al. |
| 2015/0278407 A1 * | 10/2015 | Vennelakanti et al. ...................... E21B 49/003 703/7 |
| 2015/0330204 A1 * | 11/2015 | Hildebrand .......... E21B 44/06 700/282 |
| 2016/0251900 A1 * | 9/2016 | Benson ................. E21B 7/10 175/26 |
| 2016/0260036 A1 * | 9/2016 | Jones ................ G06Q 10/0635 |
| 2016/0290129 A1 * | 10/2016 | Chorn ................... E21B 44/00 |
| 2017/0122047 A1 * | 5/2017 | Turner et al. .......... E21B 19/16 |
| 2017/0159372 A1 | 6/2017 | Zheng et al. |
| 2017/0211338 A1 | 7/2017 | Myers et al. |
| 2017/0218733 A1 * | 8/2017 | Jain ...................... E21B 44/00 |
| 2017/0364795 A1 * | 12/2017 | Anderson ............. G06N 20/10 |
| 2018/0066506 A1 | 3/2018 | Boone |
| 2018/0109110 A1 | 4/2018 | Gerdes et al. |
| 2018/0113966 A1 * | 4/2018 | Reese .................. E21B 41/00 |
| 2018/0135401 A1 | 5/2018 | Dykstra et al. |
| 2018/0156023 A1 | 6/2018 | Dykstra et al. |
| 2018/0171760 A1 | 6/2018 | Zheng et al. |
| 2018/0279021 A1 * | 9/2018 | Dorneanu ............... H04Q 9/00 |
| 2018/0328159 A1 | 11/2018 | Mandava et al. |
| 2018/0334887 A1 | 11/2018 | Dashevskiy et al. |
| 2018/0340408 A1 * | 11/2018 | Samuel ................ E21B 44/02 |
| 2018/0351952 A1 | 12/2018 | Rojas et al. |
| 2019/0033845 A1 | 1/2019 | Cella et al. |
| 2019/0048666 A1 | 2/2019 | Orban et al. |
| 2019/0048667 A1 | 2/2019 | Krippner et al. |
| 2019/0048686 A1 | 2/2019 | Krippner et al. |
| 2019/0048687 A1 | 2/2019 | Krippner et al. |
| 2019/0048704 A1 | 2/2019 | Kumaran |
| 2019/0049909 A1 | 2/2019 | Krippner et al. |
| 2019/0051431 A1 | 2/2019 | Orban et al. |
| 2019/0071828 A1 | 3/2019 | Orban |
| 2019/0071929 A1 | 3/2019 | Orban |
| 2019/0102714 A1 * | 4/2019 | Albert ................... G06F 8/38 |
| 2019/0106982 A1 | 4/2019 | Willerth et al. |
| 2019/0115758 A1 | 4/2019 | Orban et al. |
| 2019/0120023 A1 | 4/2019 | Ocegueda-Hernandez et al. |
| 2019/0128107 A1 | 5/2019 | Janakiraman et al. |
| 2019/0131905 A1 | 5/2019 | Janakiraman et al. |
| 2019/0203588 A1 * | 7/2019 | Popp et al. ............. E21B 47/12 |
| 2019/0267805 A1 | 8/2019 | Kothuru et al. |
| 2019/0361146 A1 * | 11/2019 | Roth ..................... G01V 99/005 |
| 2020/0003046 A1 | 1/2020 | Zheng et al. |
| 2020/0242286 A1 * | 7/2020 | Marchidan ............ G06N 20/00 |
| 2020/0327423 A1 * | 10/2020 | Zheng ................... E21B 44/00 |
| 2020/0401951 A1 * | 12/2020 | Ranganathan .......... G01V 1/50 |
| 2021/0017847 A1 * | 1/2021 | Aragall ................. E21B 44/02 |
| 2021/0165938 A1 * | 6/2021 | Bailey ................. G06N 3/0454 |
| 2021/0319887 A1 * | 10/2021 | Derrick et al. ......... G16H 80/00 |

FOREIGN PATENT DOCUMENTS

| | | | |
|---|---|---|---|
| RU | 2641054 C2 | 1/2018 | |
| RU | 2663011 C2 * | 8/2018 | ............ E21B 43/00 |
| WO | 2017142540 A1 | 8/2017 | |
| WO | 2017160993 A1 | 9/2017 | |
| WO | 2017204655 A1 | 11/2017 | |
| WO | 2018132786 | 7/2018 | |
| WO | 2018201118 A1 | 11/2018 | |
| WO | 2018213126 A1 | 11/2018 | |
| WO | 2018213925 A1 | 11/2018 | |
| WO | 2019084530 A1 | 5/2019 | |

(56) References Cited

FOREIGN PATENT DOCUMENTS

WO        2019118352 A1    6/2019
WO        2019118477 A1    6/2019

OTHER PUBLICATIONS

Arumugam et al., "Revealing Patterns within the Drilling Reports Using Text Mining Techniques for Efficient Knowledge Management", SPE-184062-MS, Society of Petroleum Engineers, Sep. 2016, 11 pages.

Examiner's Report issued in Russian Patent Application No. 2020130057/03 dated Jan. 24, 2022, 16 pages with English translation.

\* cited by examiner

Risk Proposal Message for Permian Basin Drilling Rig X
685

| | |
|---|---|
| 610 Location Attribute: | 611 "GPS Coordinates (X,Y)" |
| 620 Clean Time Attribute: | 621 "80%" |
| 630 Drilling Rig Nonproductive Time Attribute: | 631 "15%-19%" |
| 640 Single Well Total Construction Time Attribute: | 641 "14-18 Days to Completion" |
| 650 Risk Attribute: | 651 "5% Chance of Exceeding Bid Submission" |
| 655 Activity-based Risk Profile Attribute: | 656 "60% Chance of Losses, 40% Chance of Stuck Pipe" |
| 660 Cost-of-completing Well Attribute: | 661 "$700,000-$1,200,000" |
| 670 Bid Submission Attribute: | 671 "$1,100,000" |

*FIG. 6*

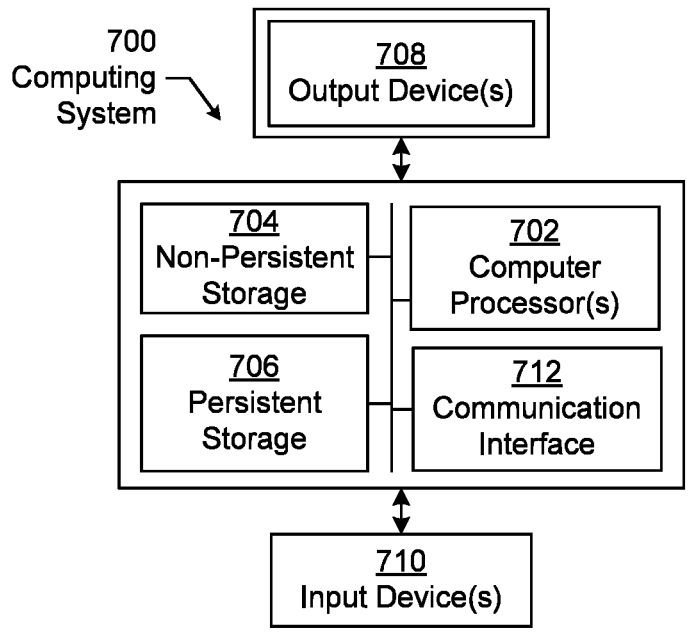
FIG. 7.1
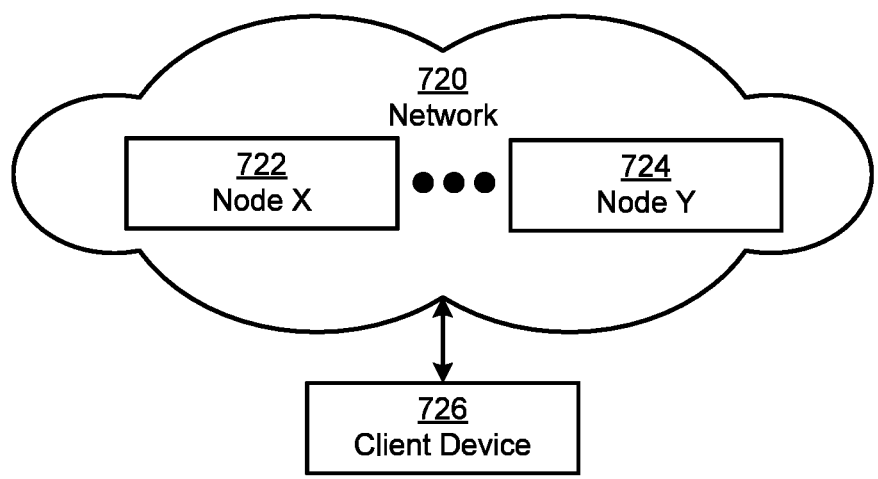
FIG. 7.2

METHOD AND SYSTEM FOR INTEGRATED WELL CONSTRUCTION

BACKGROUND

Prior to submitting a bid for a drilling project, a contractor may itemize the individual costs of the drilling project in preparation for submitting a formal bid. However, during actual construction of the drilling project, cost overruns may occur due to unforeseen issues not included in the formal bid. For example, if certain control systems malfunction, nonproductive time may occur during the construction on the drilling project. Thus, with a particular bid, there exists various risks for the contractor inherent to winning the bid for the drilling project. Accordingly, technologies are desired that can quantify these risks with precision.

SUMMARY

In general, in one aspect, embodiments relate to a method that includes obtaining, by a computer processor, geographic location data regarding a desired geographic location for a drilling rig. The method includes obtaining, by the computer processor, rig operation data regarding various drilling rigs at different geographic locations. The method includes generating, using the rig operation data, a model that identifies a level of risk associated with various rig operations. The method includes simulating, by the computer processor and using the geographic location data and the model, a sequence of rig operations for constructing a portion of a wellbore drilled by a drilling rig at the desired geographic location.

In general, in one aspect, embodiments relate to a system that includes a computer processor. The system includes a memory coupled to the computer processor and executable by the computer processor. The memory includes functionality for obtaining, by the computer processor, geographic location data regarding of a desired geographic location for a drilling rig. The memory includes functionality for obtaining, by the computer processor, rig operation data regarding various drilling rigs at different geographic locations. The memory includes functionality for generating, using the rig operation data, a model that identifies a level of risk associated with various rig operations. The memory includes functionality for simulating, using the geographic location data and the model, a sequence of rig operations for constructing a portion of a wellbore drilled by the drilling rig at the desired geographic location.

In general, in one aspect, embodiments relate to a non-transitory computer readable medium storing instructions executable by a computer processor. The instructions include functionality for obtaining, by a computer processor, geographic location data regarding of a desired geographic location for a drilling rig. The instructions include functionality for obtaining, by the computer processor, rig operation data regarding various drilling rigs at different geographic locations. The instructions include functionality for generating, using the rig operation data, a model that identifies a level of risk associated with various rig operations. The instructions include functionality for simulating, using the geographic location data and the model, a sequence of rig operations for constructing a portion of a wellbore drilling by the drilling rig at the desired geographic location.

Other aspects of the disclosure will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

FIG. 6 shows an example in accordance with one or more embodiments.

FIGS. 7.1 and 7.2 show a computing system in accordance with one or more embodiments.

DETAILED DESCRIPTION

Figure 1:
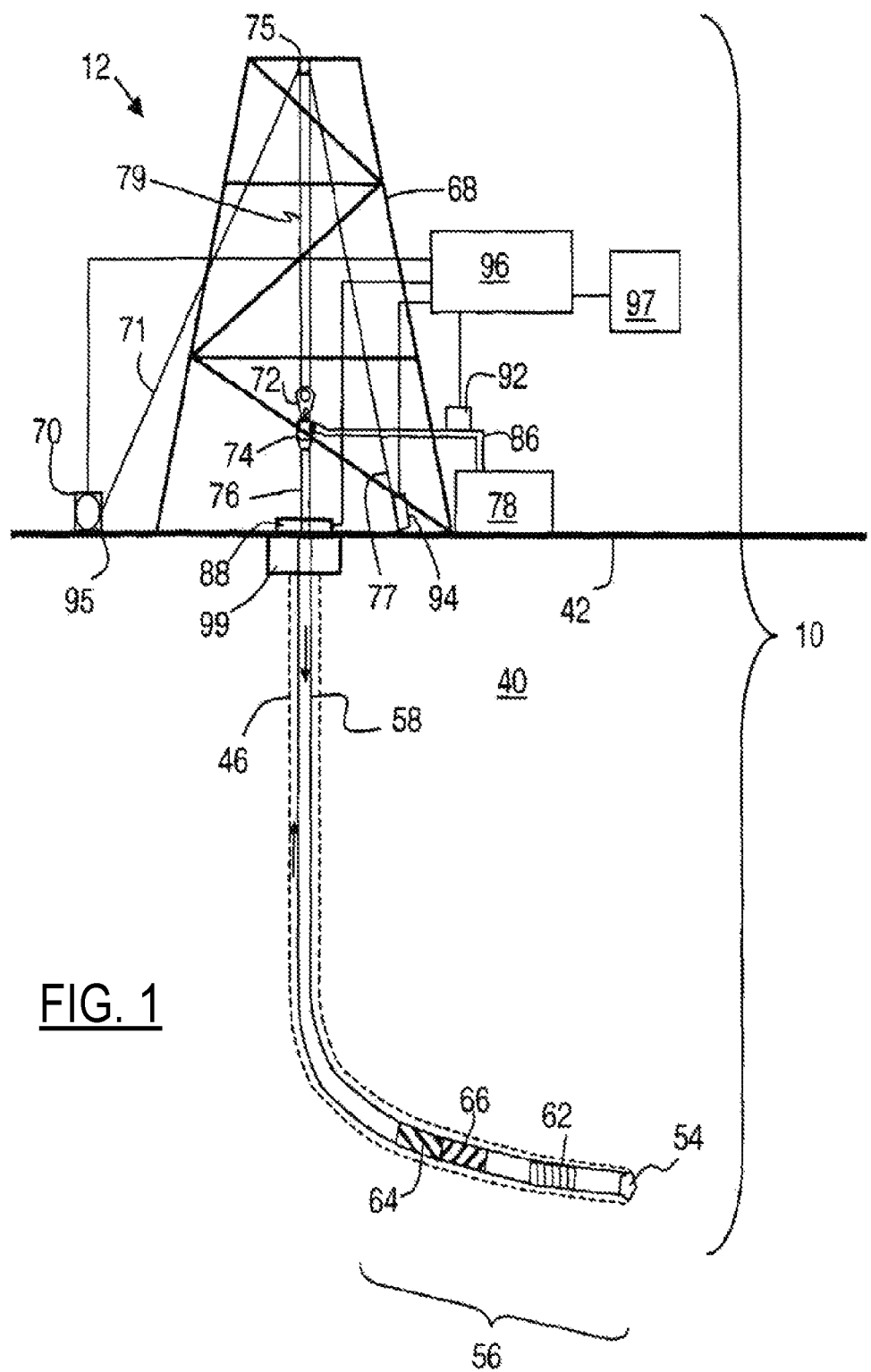
FIG. 1 shows a block diagram of a system in accordance with one or more embodiments.

Specific embodiments of the disclosure will now be described in detail with reference to the accompanying figures. Like elements in the various figures are denoted by like reference numerals for consistency.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the disclosure include systems and methods for using a model to predict various operation parameters for a drilling project. In particular, the operation parameters may include costs, projected timelines, and risks associated with construction and/or operating a well for a potential drilling location. For example, multiple data sources are accessed and analyzed regarding rig operation data involving past drilling operations proximate to the potential drilling location or using similar well designs. A remote server may filter the rig operation data for use with a model to simulate the construction and/or operation of the well at the potential drilling location. The model may use one or more artificial intelligence algorithms to analyze the filtered rig operation data as well as generate the operation parameters at the potential drilling location. Accordingly, the remote server may collect well input parameters and location information from a user device for the potential drilling location and in response transmit a report back to the user device describing the operation parameters. For example, the report may be a risk proposal message that details the amount of time, cost, and risks associated with building and/or operating one or more wells at the potential drilling location.

Turning to FIG. 1, FIG. 1 shows a block diagram of a system in accordance with one or more embodiments. FIG. 1 shows a drilling system (10) according to one or more embodiments. Drill string (58) is shown within borehole (46). Borehole (46) may be located in the earth (40) having a surface (42). Borehole (46) is shown being cut by the action of drill bit (54). Drill bit (54) may be disposed at the far end of the bottom hole assembly (56) that is attached to and forms the lower portion of drill string (58). Bottom hole assembly (56) may include a number of devices including various subassemblies. Measurement-while-drilling (MWD) subassemblies may be included in subassemblies (62). Examples of MWD measurements may include direction, inclination, survey data, downhole pressure (inside the drill pipe, and/or outside and/or annular pressure), resistivity, density, and porosity. Subassemblies (62) may also include a subassembly for measuring torque and weight on the drill bit (54). The signals from the subassemblies (62) may be processed in a processor (66). After processing, the information from processor (66) may be communicated to pulser assembly (64). Pulser assembly (64) may convert the information from the processor (66) into pressure pulses in the drilling fluid. The pressure pulses may be generated in a particular pattern which represents the data from the subassemblies (62). The pressure pulses may travel upwards though the drilling fluid in the central opening in the drill string and towards the surface system. The subassemblies in the bottom hole assembly (56) may further include a turbine or motor for providing power for rotating and steering drill bit (54).

The drilling rig (12) may include a derrick (68) and hoisting system, a rotating system, and/or a mud circulation system, for example. The hoisting system may suspend the drill string (58) and may include draw works (70), fast line (71), crown block (75), drilling line (79), traveling block and hook (72), swivel (74), and/or deadline (77). The rotating system may include a kelly (76), a rotary table (88), and/or engines (not shown). The rotating system may impart a rotational force on the drill string (58). Likewise, the embodiments shown in FIG. 1 may be applicable to top drive drilling arrangements as well. Although the drilling system (10) is shown being on land, those of skill in the art will recognize that the described embodiments are equally applicable to marine environments as well.

The mud circulation system may pump drilling fluid down an opening in the drill string. The drilling fluid may be called mud, which may be a mixture of water and/or diesel fuel, special clays, and/or other chemicals. The mud may be stored in mud pit (78). The mud may be drawn into mud pumps (not shown), which may pump the mud though stand pipe (86) and into the kelly (76) through swivel (74), which may include a rotating seal. Likewise, the described technologies may also be applicable to underbalanced drilling. If underbalanced drilling is used, at some point prior to entering the drill string, gas may be introduced into the mud using an injection system (not shown).

The mud may pass through drill string (58) and through drill bit (54). As the teeth of the drill bit (54) grind and gouge the earth formation into cuttings, the mud may be ejected out of openings or nozzles in the drill bit (54). These jets of mud may lift the cuttings off the bottom of the hole and away from the drill bit (54), and up towards the surface in the annular space between drill string (58) and the wall of borehole (46).

At the surface, the mud and cuttings may leave the well through a side outlet in blowout preventer (99) and through mud return line (not shown). Blowout preventer (99) comprises a pressure control device and a rotary seal. The mud return line may feed the mud into one or more separator (not shown) which may separate the mud from the cuttings. From the separator, the mud may be returned to mud pit (78) for storage and re-use.

Various sensors may be placed on the drilling rig (12) to take measurements of the drilling equipment. In particular, a hookload may be measured by hookload sensor (94) mounted on deadline (77), block position and the related block velocity may be measured by a block sensor (95) which may be part of the draw works (70). Surface torque may be measured by a sensor on the rotary table (88). Standpipe pressure may be measured by pressure sensor (92), located on standpipe (86). Signals from these measurements may be communicated to a surface processor (96) or other network elements (not shown) disposed around the drilling rig (12). In addition, mud pulses traveling up the drillstring may be detected by pressure sensor (92). For example, pressure sensor (92) may include a transducer that converts the mud pressure into electronic signals. The pressure sensor (92) may be connected to surface processor (96) that converts the signal from the pressure signal into digital form, stores and demodulates the digital signal into useable MWD data. According to various embodiments described above, surface processor (96) may be programmed to automatically detect one or more rig states based on the various input channels described. Processor (96) may be programmed, for example, to carry out an automated event detection as described above. Processor (96) may transmit a particular rig state and/or event detection information to user interface system (97) which may be designed to warn various drilling personnel of events occurring on the rig and suggest activity to the drilling personnel to avoid specific events.

Figure 2:
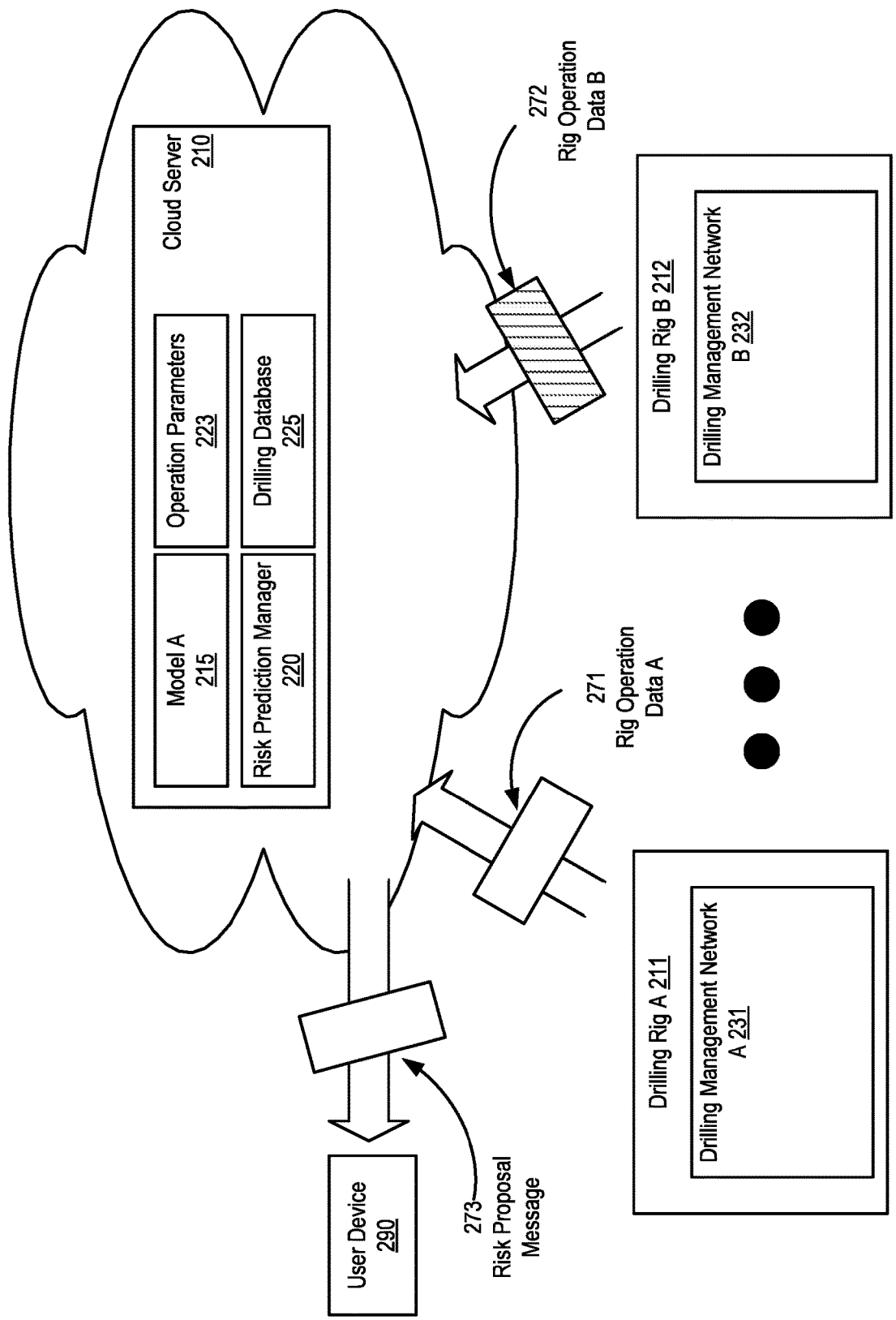
FIG. 2 shows a block diagram of a system in accordance with one or more embodiments.

Turning to FIG. 2, FIG. 2 shows a block diagram of a system in accordance with one or more embodiments. As shown in FIG. 2, a cloud server (e.g., cloud server (210)) is coupled over a network to various drilling rigs (e.g., drilling rig A (211), drilling rig B (212)), various drilling management networks (e.g., drilling management network A (231), drilling management network B (232)), and/or various user devices (e.g., user device (290)). A cloud server may be a remote server that includes hardware and/or software with functionality for communicating across a network, such as the Internet. The cloud server may include functionality for automatically obtaining rig operation data (e.g., rig operation data A (271), rig operation data B (272)) from various drilling rigs and/or drilling management networks. In one or more embodiments, the cloud server (210) may be similar to the computer system (700) described in FIGS. 7.1 and 7.2, and the accompanying description. Drilling management networks (231, 232) may be similar to drilling management network (330) described below in FIG. 3 and the accompanying description.

In some embodiments, a cloud server includes functionality to obtain rig operation data (e.g., rig operation data A (271), rig operation data B (272)) from various drilling rigs (e.g., drilling rig A (211), drilling rig B (212)) and/or drilling management networks (e.g., drilling management network A (231), drilling management network B (232)). In one or more embodiments, rig operation data include financial costs and/or amounts of time associated with a drilling operation at a particular rig. In some embodiments, rig operation data may include information related to the equipment used for drilling or constructing the well, including both surface and downhole equipment or any other equipment used in the rig operations. Likewise, rig operation data may include information relating to sensor data and other measurements regarding such drilling equipment, drilling operations, maintenance operations, and/or other operations performed around a drilling rig. In some embodiments, rig operation data include periodic drilling reports from drilling sites and data from publically-available databases. In other embodiments, rig operation data includes interpolated and/or extrapolated data for a desired drilling location based on other rig operation data, such as legacy data. Moreover, for example, the cloud server (210) may obtain rig operation data in real time from the drilling management networks (231, 232) or at periodic intervals, such as daily, weekly, monthly, etc. A cloud server may store filtered and/or unfiltered rig operation data in a local database (e.g., drilling database (225)).

In some embodiments, a cloud server includes a risk prediction manager (e.g., risk prediction manager (220)). A risk prediction manager may be hardware and/or software that includes functionality for determining one or more operation parameters (e.g., operation parameters (223)). For example, operation parameters may output data that project individual or aggregate costs for performing one or more rig operations, such as drilling operations, at a hypothetical drilling rig at a desired geographic location. Likewise, an operation parameter may also specify an amount of time to complete a particular operation. Operation parameters may also include range of values as well as a probability distribution that one of the values occurs. Examples of operation parameters may include an amount of nonproductive time at a drilling rig, a cost of constructing the drilling rig (including for example the equipment used in the rig operations) at a particular location, an amount of time to complete construction of the drilling rig, and/or a cost of drilling a wellbore according to various well input parameters. Well input parameters may include a wellbore radius, a length of the wellbore, and/or other design parameters for the wellbore.

In some embodiments, the cloud server includes a model (e.g., model A (215)) that include hardware and/or software with functionality for predicting one or more operation parameters (e.g., operation parameters (223)). For example, the model A (215) may include various data virtualization tools, search and knowledge discovery tools, stream analytics tools, relational databases, NoSQL databases, and various applications for generating outputs based on location information, well input parameters, rig operation data, and other information. In some embodiments, a model include functionality for determining operation parameters based on one or more artificial intelligence algorithms. For example, artificial intelligence algorithms may include decision tree algorithms, one or more support vector machines, an ensemble method, and/or a naïve Bayes classifier algorithm. In some embodiments, the model identifies a level of risk associated with various rig operations, e.g., one or more probabilities that a rig operation is completed without nonproductive time or below a threshold amount of nonproductive time.

Further, the risk prediction manager (220) may determine various costs and/or an amount of time for constructing and operating a drilling rig at a particular location, e.g., a desired geographic location submitted in a request for a proposal. As such, the risk prediction manager (220) may generate a total estimate for constructing a well as well as estimates for various rig operations performed at the drilling rig. An estimate may be included in a risk proposal message (e.g., risk proposal message (273)), for example. Accordingly, the risk prediction manager (220) may transmit a risk proposal message to a user device (e.g., user device (290)) automatically or in response to a request obtained from the user device. For example, a user may select a desired geographic location for a potential drilling site with the user device and transmit various well input parameters for the drilling site to a cloud server. In response, the cloud server may generate a risk proposal message and transmit the message back to the user device.

User devices (e.g., user device (290)) may include hardware and/or software for receiving inputs from a user and/or providing outputs to a user. Moreover, a user device may be coupled to a drilling management network and/or a cloud server. For example, user devices may include functionality for presenting data and/or receiving inputs from a user regarding various drilling operations and/or maintenance operations performed within a drilling management network. Examples of user devices may include personal computers, smartphones, human machine interfaces, and any other devices coupled to a network that obtain inputs from one or more users, e.g., by providing a graphical user interface (GUI). Likewise, a user device may present data and/or receive control commands from a user for operating a drilling rig.

Figure 3:
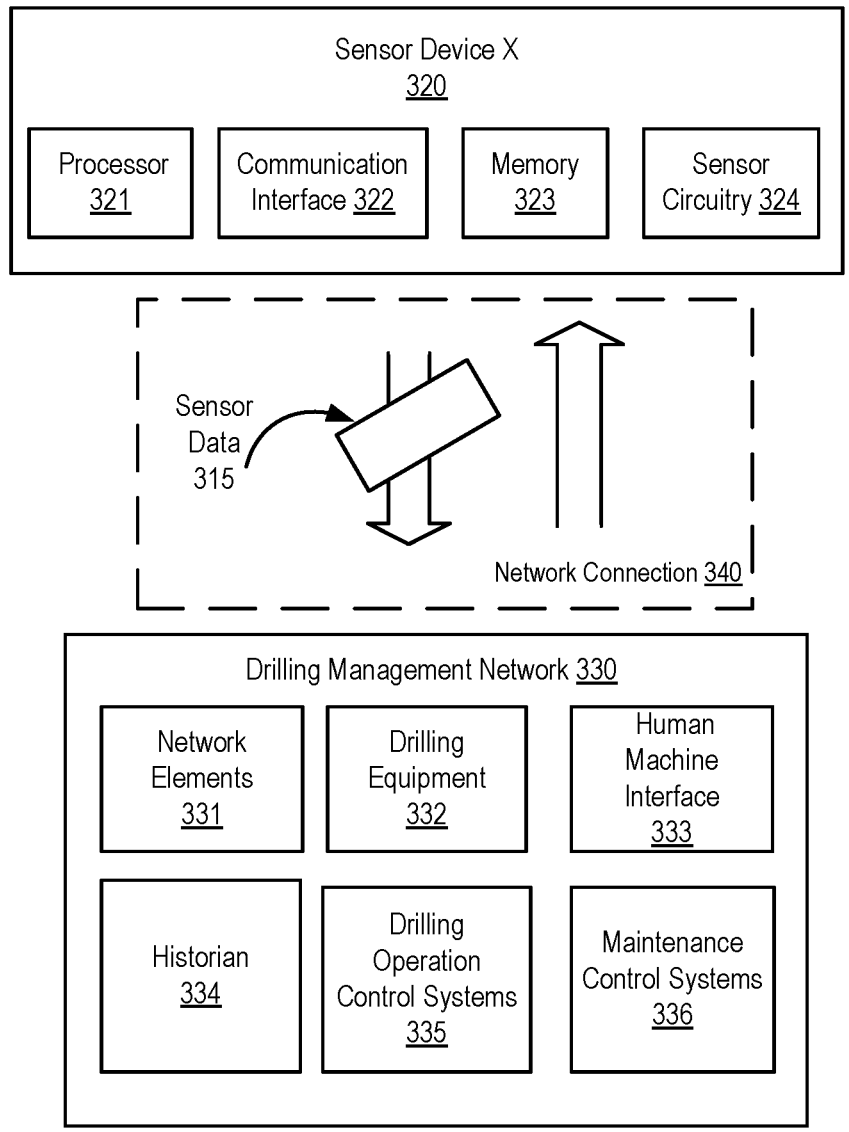
FIG. 3 shows a block diagram of a system according to one or more embodiments.

Turning to FIG. 3, FIG. 3 shows a block diagram of a system in accordance with one or more embodiments. As shown in FIG. 3, a drilling management network (330) may include a human machine interface (HMI) (e.g., HMI (333)), a historian (e.g., historian (334)), and various network elements (e.g., network elements (331)). A HMI may be hardware and/or software coupled to the drilling management network (330). For example, the HMI may allow the operator to interact with the drilling system, e.g., to send a command to operate an equipment, or to view sensor information from drilling equipment. The HMI may include functionality for presenting data and/or receiving inputs from a user regarding various drilling operations and/or maintenance operations. For example, a HMI may include software to provide a graphical user interface (GUI) for presenting data and/or receiving control commands for operating a drilling rig. A network element (e.g., network elements (331)) may refer to various hardware components within a network, such as switches, routers, hubs or any other logical entities for uniting one or more physical devices on the network. In particular, a network element, the human machine interface, and/or the historian may be a computing system similar to the computing system (700) described in FIGS. 7.1 and 7.2, and the accompanying description.

In one or more embodiments, a sensor device (e.g., sensor device X (320)) is coupled to the drilling management network (330). In particular, a sensor device may include hardware and/or software that includes functionality to obtain one or more sensor measurements, e.g., a sensor measurement of an environment condition proximate the sensor device. The sensor device may process the sensor measurements into various types of sensor data (e.g., sensor data (315)). For example, the sensor device X (320) may include functionality to convert sensor measurements obtained from sensor circuitry (e.g., sensor circuitry (324)) into a communication protocol format that may be transmitted over the drilling management network (330) by a communication interface (e.g., communication interface (322)). Sensor devices may include pressure sensors, torque sensors, rotary switches, weight sensors, position sensors, microswitches, etc. The sensor device may include smart sensors. In some embodiments, sensor devices include sensor circuitry without a communication interface or memory. For example, a sensor device may be coupled with a computer device that transmits sensor data over a drilling management network.

Moreover, a sensor device may include a processor (e.g., processor (321)), a communication interface (e.g., communication interface (322)), memory (e.g., memory (323)), and sensor circuitry (e.g., sensor circuitry (324)). The processor may be similar to the computer processor (702) described below in FIG. 7.1 and the accompanying description. The communication interface (322) may be similar to the communication interface (712) describe below in FIG. 7.1 and the accompanying description. The memory (323) may be similar to the non-persistent storage (704) and/or the persistent storage (706) described below in FIG. 7.1 and the accompanying description. The sensor circuitry (324) may be similar to various sensors (e.g., hookload sensor (94), block sensor (95), pressure sensor (92), etc.) described in FIG. 1 and the accompanying description.

In one or more embodiments, a drilling management network may include drilling equipment (e.g., drilling equipment (332)) such as draw works (60), top drive, mud pumps and other components described above in FIG. 1 and the accompanying description). The drilling management network (330) may further include various drilling operation control systems (e.g., drilling operation control systems (335)) and various maintenance control systems (e.g., maintenance control systems (336)). Drilling operation control systems and/or maintenance control systems may include, for example, programmable logic controllers (PLCs) that include hardware and/or software with functionality to control one or more processes performed by a drilling rig, including, but not limited to the components described in FIG. 1. Specifically, a programmable logic controller may control valve states, fluid levels, pipe pressures, warning alarms, and/or pressure releases throughout a drilling rig. In particular, a programmable logic controller may be a ruggedized computer system with functionality to withstand vibrations, extreme temperatures, wet conditions, and/or dusty conditions, for example, around a drilling rig. Without loss of generality, the term "control system" may refer to a drilling operation control system that is used to operate and control the equipment, a drilling data acquisition and monitoring system that is used to acquire drilling process and equipment data and to monitor the operation of the drilling process, or a drilling interpretation software system that is used to analyze and understand drilling events and progress.

Moreover, drilling operation control systems and/or maintenance control systems may refer to control systems that include multiple PLCs within the drilling management network (330). For example, a control system may include functionality to control operations within a system, assembly, and/or subassembly described above in FIG. 1 and the accompanying description. As such, one or more of the drilling operation control systems (335) may include functionality to monitor and/or perform various drilling processes with respect to the mud circulation system, the rotating system, the hoisting system, a pipe handling system, and/or various other drilling activities described with respect to FIG. 1 and the accompanying description. Likewise, one or more of the maintenance control systems (336) may include functionality to monitor and/or perform various maintenance activities regarding drilling equipment located around a drilling rig. While drilling operation control systems and maintenance control systems are shown as separate devices in FIG. 3, in one or more embodiments, a programmable logic controller and other drilling equipment (332) on a drilling rig may be used in a drilling operation control system and a maintenance control system at the same time.

In one or more embodiments, a sensor device includes functionality to establish a network connection (e.g., network connection (340)) with one or more devices and/or systems (e.g., cloud server (210), drilling operation control systems (335), maintenance control systems (336)) on a drilling management network. In one or more embodiments, for example, the network connection (340) may be an Ethernet connection that establishes an Internet Protocol (IP) address for the sensor device X (320). Accordingly, one or more devices and/or systems on the drilling management network (330) may transmit data packets to the sensor device X (320) and/or receive data packets from the sensor device X (320) using the Ethernet network protocol. For example, sensor data (e.g., sensor data (315)) may be sent over the drilling management network (330) in data packets using a communication protocol. Sensor data may include sensor measurements, processed sensor data based on one or more underlying sensor measurements or parameters, metadata regarding a sensor device such as timestamps and sensor device identification information, content attributes, sensor configuration information such as offset, conversion factors, etc. As such, the sensor device X (320) may act as a host device on the drilling management network (330), e.g. as a network node and/or an endpoint on the drilling management network (330). In one embodiment, one or more sensors may connect to the drilling management network through a power-over-Ethernet network.

In some embodiments, a drilling management network may collect rig operation data from sensors, control systems, and/or other network devices around a drilling rig. After collection, the drilling management network may then transmit the rig operation data to a remote server similar to the cloud server (210) described above in FIG. 2 and the accompanying description. Likewise, a cloud server may transmit a request to one or more network devices on a drilling management network for particular rig operation data. Thus, drilling management networks may include functionality for automating the data gathering process for collecting rig operation data in order to update drilling databases on a cloud server periodically or in real time.

While FIGS. 1, 2, and 3 show various configurations of components, other configurations may be used without departing from the scope of the disclosure. For example, various components in FIGS. 1, 2, and 3 may be combined to create a single component. As another example, the functionality performed by a single component may be performed by two or more components.

Figure 4:
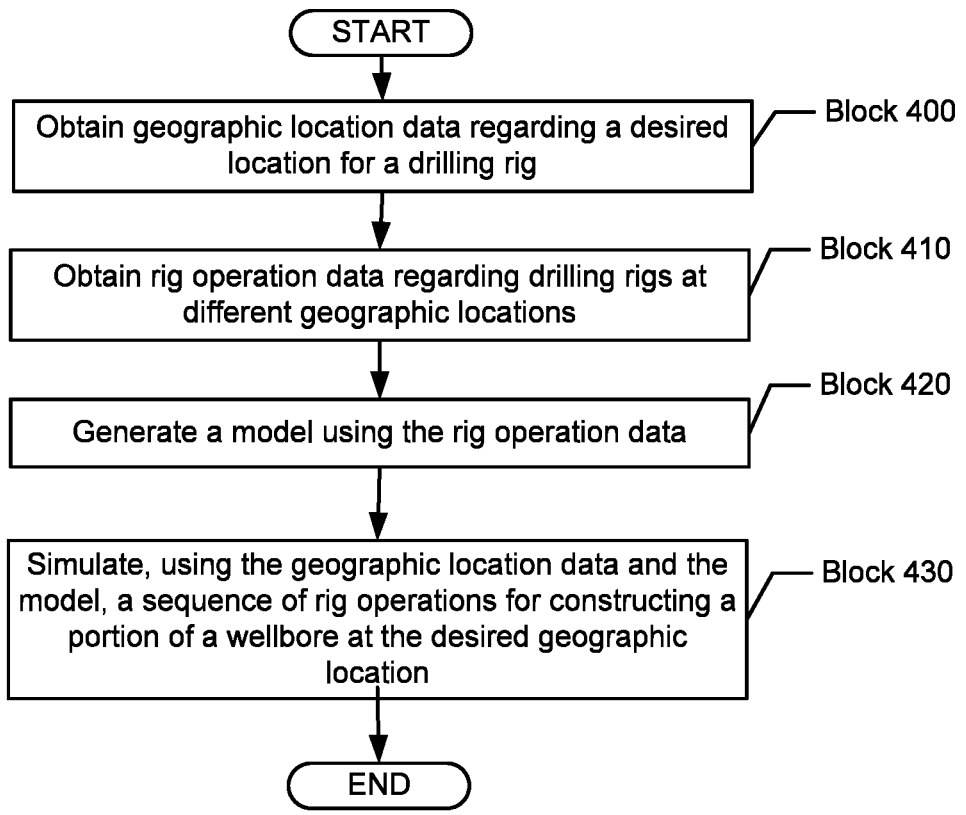
FIGS. 4 and 5 show flowcharts in accordance with one or more embodiments.

Turning to FIG. 4, FIG. 4 shows a flowchart in accordance with one or more embodiments. Specifically, FIG. 4 describes a general method for simulating rig operations at a desired geographic location. One or more blocks in FIG. 4 may be performed by one or more components (e.g., risk prediction manager (220)) as described in FIGS. 1, 2, and/or 3. While the various blocks in FIG. 4 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 400, geographic location data is obtained regarding a desired geographic location for a drilling rig in accordance with one or more embodiments. For example, geographic location data may correspond to global positioning system (GPS) coordinates or other information identifying a geographic region of interest. The geographic location information may also include a radius defining a coverage area of the desired geographic location, e.g., as multiple drilling sites may be available for one or more drilling rigs. Moreover, the desired geographic location may correspond to one or more potential drilling locations in a particular geological region, e.g., Permian basin, Bakken formation, etc.

In Block 410, rig operation data is obtained regarding various drilling rigs at different geographic locations in accordance with one or more embodiments. In some embodiments, a cloud server gathers information from various data sources, e.g., detailed daily drilling reports (DDR) from multiple drilling rigs, external drilling databases, etc. A risk prediction manager may parse data from different data sources to extract rig operation data corresponding to one or more predetermined attributes. Examples of rig operation data may include an amount of drilling time for a particular drilling operation as well as other attributes of the drilling operation. For example, the rig operation data may describe the drilling operation based on a hole size of a wellbore, a predetermined interval that the wellbore is drilled, a type of basin being drilled by the wellbore, a type of petroleum play comprising the wellbore, a drill string design (including but not limited to the bottomhole assembly), a casing and completion design for the wellbore, and surface equipment needed for the operation. Rig operation data may also include historical data at a drilling rig, such as clean time (i.e., well construction time without nonproductive time), nonproductive time (NOT) at the drilling rig, and/or the identified causes relating to the nonproductive time.

In some embodiments, the rig operation data includes data regarding various sequential drilling operations for constructing a wellbore. For example, rig operation data may include total costs, completion time for a wellbore, etc., which may be more comprehensive than data directed to a singular phase or equipment (such as a BHA, completion design, etc.) in a well construction process. Thus, the sequential drilling operations are intended to encompass different pieces of equipment as drilling progresses from one phase to another, while also being comprehensive at each drilling phase. Accordingly, the rig operation data may be an aggregation of data regarding different phases or milestones involved in drilling and/or completing an entire wellbore at one or more drilling locations. Thus, the rig operation data may provide an overview of the entire costs and risks associated with drilling a potential well.

Furthermore, the rig operation data may be stored in a database on a cloud server or in another remote location. In some embodiments, a risk prediction manager may use rig operation data from different locations to generate rig operation data for an unexplored region. For example, synthetic rig operation data may be generated using one or more artificial intelligence algorithms with respect to a well profile and location using data from a similar well profile and location. Rig operation data may also be obtained from various sensor devices disposed around a drilling management network. In particular, the sensor devices may be similar to the sensor device X (320) described in FIG. 3 and the accompanying description. In one or more embodiments, the sensor device connects directly to a risk prediction manager. In some embodiments, various control systems in a drilling management network may provide rig operation data directly to the risk prediction manager.

In Block 420, a model is generated using rig operation data in accordance with one or more embodiments. Specifically, rig operation data may be filtered to produce a sparse dataset, e.g., a dataset that is smaller and more manageable than the data in a drilling database. After filtering, a model may analyze the dataset using geographic location data and well input parameters. For example, the geographic location data may correspond to one or more physical dimensions defining one or more sites for a proposed wellbore, where the location information may narrow the area of focus for the model. Likewise, the model may also obtain various well input parameters of a proposed wellbore design. The model may be similar to the model A (215) described above in FIG. 2 and the accompanying description.

In Block 430, a sequence of rig operations for constructing a portion of a wellbore at a desired geographic location are simulated using geographic location data and a model in accordance with one or more embodiments. For example, the simulations may be performed prior to construction of a wellbore in order to determine various possible risks associated with the construction. In some embodiments, a risk prediction manager may perform various Monte Carlo simulations using a model. For example, Monte Carlo simulations may generate various possible outcomes corresponding to one or more operation parameters within the sequence of rig operations, such as amounts of clean time, various degrees of risk in well construction and/or operating the drilling, and ranges of cost associated with the drilling rig. Moreover, the sequence of rig operations may include specific drilling operations based on a particular well design, e.g., simulating a drilling path for a well design defined by predetermined well input parameters. In some embodiments, the sequence of rig operations include completing the wellbore, surface operations, and downhole operations.

Figure 5:
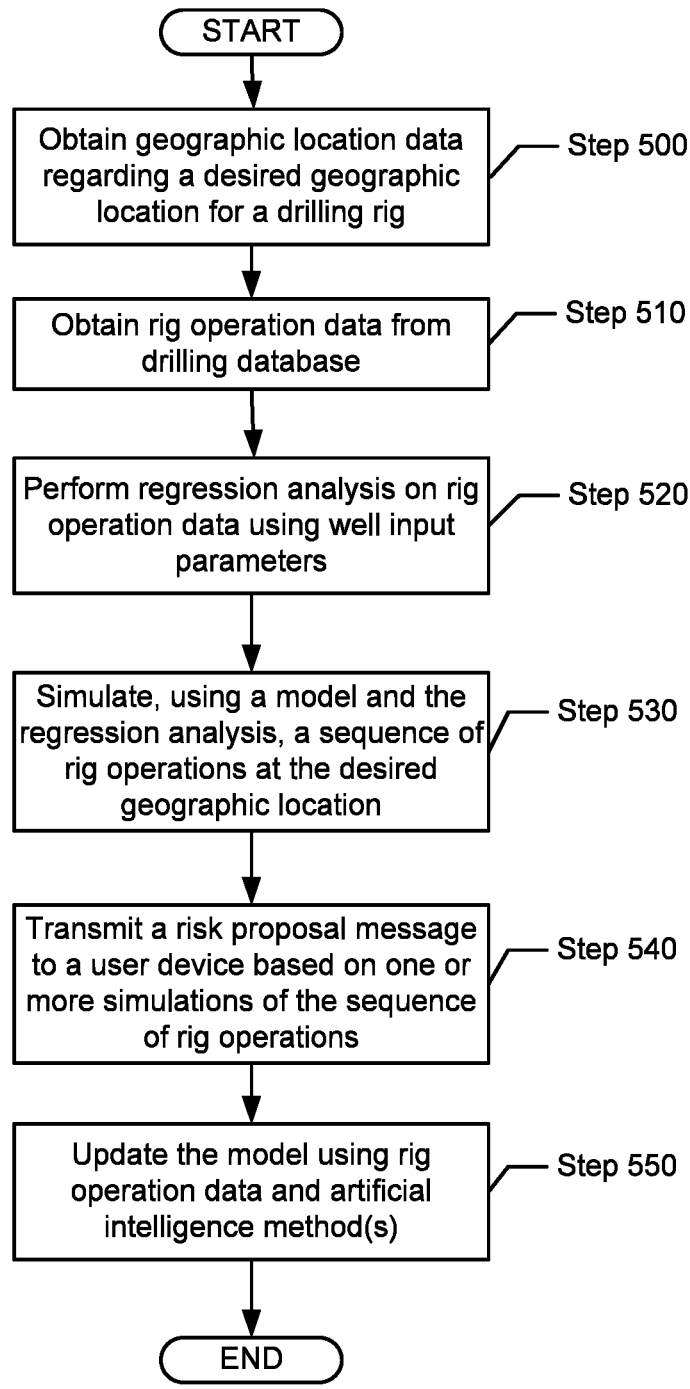

Turning to FIG. 5, FIG. 5 shows a flowchart in accordance with one or more embodiments. Specifically, FIG. 5 describes a general method for using a model for predicting operation parameters of a sequence of rig operations. One or more blocks in FIG. 5 may be performed by one or more components (e.g., risk prediction manager (220)) as described in FIGS. 1, 2, and/or 3. While the various blocks in FIG. 5 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 500, geographic location data is obtained regarding a desired geographic location for a drilling rig in accordance with one or more embodiments. Block 500 may be similar to Block 400 described above in FIG. 4 and the accompanying description. In some embodiments, the geographic location data may be part of a request for a risk proposal message transmitted by a user device to a cloud server. For example, a user may request a risk proposal message regarding a desired geographic location for a drilling rig. Accordingly, a user device may transmit the geographic location data with various well input parameters to a risk prediction manager on a cloud server.

In Block 510, rig operation data is obtained from a drilling database in accordance with one or more embodiments. Block 510 may be similar to Block 410 described above in FIG. 4 and the accompanying description. The drilling database may be similar to drilling database (225) described above in FIG. 2 and the accompanying description.

In Block 520, a regression analysis is performed on rig operation data using various well input parameters in accordance with one or more embodiments. In some embodiments, multiple regression analyses are performed on rig operation data with a dependency on time and, separately, on cost to filter the rig operation data into a particular dataset. For example, independent variables for performing a time analysis may include various drilling operation information such as a hole size at a wellbore, a drilling interval at the wellbore, etc. Independent variables for cost estimation may include a type of basin and a type of petroleum play to be drilled, casing design for a wellbore, etc.

In particular, a regression analysis may provide an estimated range of clean time and cost based on various well input parameters for a wellbore. The well input parameters may be provided with the geographic location data in Block 500, for example. Clean time and nonproductive time within the rig operation data may be used by a risk prediction manager to verify a degree of precision of the outputs of a model. As such, the results of one or more regression analyses may be compared with user data to determine a likelihood of accuracy. In some embodiments, a regression analysis generates a distribution for various rig operation data values that considers the frequency and effect on other rig operation values.

In Block 530, a sequence of rig operations are simulated using a model and a regression analysis at a desired geographic location in accordance with one or more embodiments. The simulation may be similar to the simulation performed in Block 430 described above in FIG. 4 and the accompanying description.

In some embodiments, rig operations undergo multiple simulations using updated rig operation data, geographic location data, and/or an updated model. As such, Block 530 may be performed iteratively with or without repeating a regression analysis. Likewise, rig operations may be resimulated using the same or different rig operation data. Thus, the amount of time to obtain operation parameters for a drilling rig at a desired geographic location may be reduced accordingly by removing one or more blocks during an additional simulation.

In Block 540, a risk proposal message is transmitted to a user device based on one or more simulations of a sequence of rig operations in accordance with one or more embodiments. In some embodiments, a risk proposal message is generated that may describe a total cost of a drilling project, various itemized costs of the drilling project, a total amount of time for completing the drilling project, various individual times for completing different milestones relating to the drilling project, etc. A risk prediction manager may automatically generate a risk proposal message using various simulations performed at a desired geographical location in response to a request from a user device. Once generated, the risk prediction manager may transmit the risk proposal message to a user device where the message is presented on a display of the user device.

Moreover, the risk proposal message may include various risks of a drilling project determined by performing simulations at a desired geographic location. In particular, a risk prediction manager may use the model to determine various risk probabilities regarding costs and amounts of clean time and/or nonproductive time. For example, the risk proposal message may describe the probability that a drilling project will exceed a proposed bid. Thus, the risk proposal message may be used in preparation of submitting a bid for a drilling project. Likewise, multiple risk proposal messages may be generated for different well input parameters and desired geographic locations, e.g., as part of a negotiation process for a commercial contrast for a drilling project.

Turning to FIG. 6, FIG. 6 provides an example of a risk proposal message. The following example is for explanatory purposes only and not intended to limit the scope of the disclosed technology.

Turning to FIG. 6, FIG. 6 shows a risk proposal message (685) for a Permian Basin Drilling Rig X. In particular, the risk proposal message (685) describes various rig operation attributes (i.e., location attribute (610), clean time attribute (620), drilling rig nonproductive time attribute (630), single well total construction time attribute (640), risk attribute (650), activity-based risk profile attribute (655), cost-of-completing well attribute (660), and a bid submission attribute (670)). For the location attribute (610), the value of the respective predicted operation parameter is GPS Coordinates (X, Y) (611). For the clean time attribute (620), the value of the respective predicted operation parameter is 80% (621), where 80% of the construction time may be directed to constructing a drilling rig and drilling a wellbore. For the drilling rig nonproductive time attribute (630), the value of the respective predicted operation parameter is a range of values (631) from 15% to 19% of the construction time being directed to nonproductive time. For the single well total construction time attribute (640), the value of the respective predicted operation parameter is a range of values (641) from 14 to 18 days to complete the wellbore. For the risk attribute (650), the value of the predicted operation parameter is a 5% chance (651) that the construction of the wellbore exceeds the value of the bid submission attribute (670). For the activity-based risk profile attribute (655), the value of the predicted operation parameter is a 60% chance (656) that the construction of the wellbore will result in fluid losses, and the value of the predicted operation parameter is a 40% chance (656) that the construction of the wellbore results in a stuck pipe. In a stuck pipe, the pipe cannot be freed from the hole without being damaged, and without exceeding the drilling rig's maximum allowed hook load. For the cost-of-completing well attribute (660), the respective value of the predicted operation parameter is a range of values (661) from $700,000 to $1,200,000. For the bid submission attribute (670), the respective value of the predicted operation parameter is $1,100,000 (671).

Keeping with FIG. 6, the risk proposal message (685) may be shown in a graphical user interface of a user device (not shown). Likewise, a user may provide various inputs to the user device to modify one or more of the attribute values (611, 621, 631, 641, 651, 656, 661, 671). A risk prediction manager (not shown) may then automatically update the other attributes accordingly. For example, based on the value of the single well total construction time attribute (640), a user may adjust the value of the location attribute (610) to decrease the number of days to complete the well.

Returning to FIG. 5, in Block 550, a model is updated using rig operation data and one or more artificial intelligence methods in accordance with one or more embodiments. In some embodiments, the model is updated periodically as rig operation data is further collected from various data sources. Further, one or more artificial intelligence algorithms may adjust the model based on comparing the model's operation parameters and actual rig operation data. For example, a risk prediction manager may adjust the model iteratively using a search method until the difference between predicted operation parameters and the actual rig operation data satisfies a predetermined criterion. For example, the predetermined criterion may be convergence of the operation parameters at a local or global minimum. Various search methods may be used to adjust the model, such as a gradient descent, a Newton-Raphson method, and various other types of search methods.

With respect to the embodiments discussed above in FIGS. 4 and 5, various procedures are automated as to provide faster delivery time in comparison to manual methods for preparing and transmitting drilling project proposals. For example, a proposal produced using offset well analysis may take a month to assess time, cost, and risks of the proposal. Before even receiving user data for well time estimation, business development discussions and a signed non-disclosure agreement may be required. Likewise, the data analytics described above may provide a proactive approach to identifying potential drilling projects based upon: performance, permits, and risk. Likewise, automating the procedures for risk size identification from multiple data sources improves consistency for risk assignment among drilling projects. Moreover, by performing an iterative quality check between the outputs of the prediction model and user data, issues in risk proposal messages may be identified prior to formal bid submissions.

Embodiments may be implemented on a computing system. Any combination of mobile, desktop, server, router, switch, embedded device, or other types of hardware may be used. For example, as shown in FIG. 7.1, the computing system (700) may include one or more computer processors (702), non-persistent storage (704) (e.g., volatile memory, such as random access memory (RAM), cache memory), persistent storage (706) (e.g., a hard disk, an optical drive such as a compact disk (CD) drive or digital versatile disk (DVD) drive, a flash memory, etc.), a communication interface (712) (e.g., Bluetooth interface, infrared interface, network interface, optical interface, etc.), and numerous other elements and functionalities.

The computer processor(s) (702) may be an integrated circuit for processing instructions. For example, the computer processor(s) may be one or more cores or micro-cores of a processor. The computing system (700) may also include one or more input devices (710), such as a touchscreen, keyboard, mouse, microphone, touchpad, electronic pen, or any other type of input device.

The communication interface (712) may include an integrated circuit for connecting the computing system (700) to a network (not shown) (e.g., a local area network (LAN), a wide area network (WAN) such as the Internet, mobile network, or any other type of network) and/or to another device, such as another computing device.

Further, the computing system (700) may include one or more output devices (708), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (702), non-persistent storage (704), and persistent storage (706). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure.

The computing system (700) in FIG. 7.1 may be connected to or be a part of a network. For example, as shown in FIG. 7.2, the network (720) may include multiple nodes (e.g., node X (722), node Y (724)). Each node may correspond to a computing system, such as the computing system shown in FIG. 7.1, or a group of nodes combined may correspond to the computing system shown in FIG. 7.1. By way of an example, embodiments of the disclosure may be implemented on a node of a distributed system that is connected to other nodes. By way of another example, embodiments of the disclosure may be implemented on a distributed computing system having multiple nodes, where each portion of the disclosure may be located on a different node within the distributed computing system. Further, one or more elements of the aforementioned computing system (700) may be located at a remote location and connected to the other elements over a network.

Although not shown in FIG. 7.2, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (722), node Y (724)) in the network (720) may be configured to provide services for a client device (726). For example, the nodes may be part of a cloud computing system. The nodes may include functionality to receive requests from the client device (726) and transmit responses to the client device (726). The client device (726) may be a computing system, such as the computing system shown in FIG. 7.1. Further, the client device (726) may include and/or perform all or a portion of one or more embodiments of the disclosure.

The computing system or group of computing systems described in FIGS. 7.1 and 7.2 may include functionality to perform a variety of operations disclosed herein. For example, the computing system(s) may perform communication between processes on the same or different systems. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until the server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope of the disclosure. The processes may be part of the same or different application and may execute on the same or different computing system.

Rather than or in addition to sharing data between processes, the computing system performing one or more embodiments of the disclosure may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the disclosure, may extract one or more data items from the obtained data. For example, the extraction may be performed as follows by the computing system (700) in FIG. 7.1. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 7.1, while performing one or more embodiments of the disclosure, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments of the disclosure, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 7.1 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 7.1 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions presents only a few examples of functions performed by the computing system of FIG. 7.1 and the nodes and/or client device in FIG. 7.2. Other functions may be performed using one or more embodiments of the disclosure.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

What is claimed is:

1. A method, comprising:
    obtaining, by a computer processor, geographic location data regarding a desired geographic location for a first drilling rig;
    obtaining, by the computer processor, rig operation data regarding a plurality of drilling rigs at different geographic locations;
    performing one or more regression analyses on the rig operation data with a dependency on time, cost, or a combination thereof so as to filter the rig operation data and generate an estimated range of clean time and cost;
    generating, using the rig operation data, a model that identifies a level of risk associated with a plurality of rig operations;
    simulating, by the computer processor and using the geographic location data and the model, a sequence of rig operations for constructing a portion of a wellbore drilled by the first drilling rig at the desired geographic location based at least in part on the model and the one or more regression analyses;
    adjusting the model, using an artificial intelligence algorithm, based on a comparison of operation parameters of the model and the rig operation data;
    determining a precision of the model based on a comparison of the estimated range of clean time and non-productive time with a measured clean time and a measured non-productive time, respectively; and
    generating a control signal to operate an equipment based at least in part on the results of the simulating, wherein operation of the equipment changes in response to receiving the control signal.

2. The method of claim 1,
    wherein the sequence of rig operations are simulated prior to construction of the wellbore at the desired geographic location, and
    wherein the sequence of rig operation comprises surface operations, and downhole operations.

3. The method of claim 1, wherein the model further identifies a total cost and amount of time associated with performing a predetermined drilling operation for constructing the portion of the wellbore.

4. The method of claim 1,
    wherein the rig operation data comprises an amount of drilling time for a predetermined drilling operation based on a hole size of a wellbore, a predetermined interval that the wellbore is drilled, a type of basin being drilled by the wellbore, a type of petroleum play comprising the wellbore, and a casing design for the wellbore, and
    wherein the rig operation data further comprises a cost of the predetermined drilling operation.

5. The method of claim 1, further comprising:
    obtaining a plurality of well input parameters for constructing the wellbore; and
    wherein the one or more regression analyses on the rig operation data are performed based on the plurality of well input parameters.

6. The method of claim 1, wherein the clean cost comprises a total amount of time minus an amount of nonproductive time for constructing the wellbore, and wherein the cost comprises a cost of constructing the wellbore at the desired geographic location, a cost of operating the first drilling rig at the desired geographic location, or both.

7. The method of claim 1, wherein generating the model comprises:
obtaining the model; and
updating the model in real time based on the rig operation data,
wherein the model is updated iteratively using a search method until the model converges to a predetermined criterion.

8. The method of claim 1, wherein simulating the sequence of rig operations comprises performing one or more Monte Carlo simulations for constructing the portion of the wellbore.

9. The method of claim 1, wherein generating the model comprises using an artificial intelligence algorithm on the rig operation data, and wherein the artificial intelligence algorithm is selected from a group consisting of a decision tree algorithm, a support vector machine, an ensemble method, and a naive Bayes classifier algorithm.

10. The method of claim 1, wherein obtaining the rig operation data comprises:
establishing, at a remote server, a first network connection to a drilling management network at a second drilling rig,
wherein the drilling management network is configured to operate automatically a plurality of control systems at the second drilling rig, and
wherein the rig operation data is obtained from the drilling management network.

11. The method of claim 1, wherein simulating the sequence of rig operations comprises determining an amount of risk for constructing the portion of the wellbore by the first drilling.

12. The method of claim 1, further comprising:
comparing the clean time and cost generated using the one or more regression analyses with an observed clean time and cost; and
updating the model based on the comparing.

13. A system, comprising:
a computer processor; and
a memory coupled to the computer processor and executable by the computer processor, the memory comprising functionality for:
obtaining geographic location data regarding of a desired geographic location for a first drilling rig;
obtaining rig operation data regarding a plurality of drilling rigs at different geographic locations;
performing one or more regression analyses on the rig operation data with a dependency on time, cost, or a combination thereof so as to filter the rig operation data and generate an estimated range of clean time, non-productive time, and cost;
generating, using the rig operation data, a model that identifies a level of risk associated with a plurality of rig operations;
simulating, by the computer processor and using the geographic location data and the model, a sequence of rig operations for constructing a portion of a wellbore drilled by the first drilling rig at the desired geographic location based at least in part on the model and the one or more regression analyses;
determining a precision of the model based on a comparison of the estimated range of clean time and non-productive time with a measured clean time and a measured non-productive time, respectively;
adjusting the model, using an artificial intelligence algorithm, based on a comparison of operation parameters of the model and the rig operation data; and
generating a control signal to operate an equipment based at least in part on the results of the simulating, wherein operation of the equipment changes in response to receiving the control signal.

14. The system of claim 13,
wherein the sequence of rig operations are simulated prior to construction of the wellbore at the desired geographic location, and
wherein the sequence of rig operation comprises surface operations and downhole operations at the desired geographic location.

15. The system of claim 13, wherein generating the model comprises:
obtaining the model; and
updating the model in real time based on the rig operation data,
wherein the model is updated iteratively using a search method until the model converges to a predetermined criterion.

16. The system of claim 13, wherein generating the model comprises using an artificial intelligence algorithm on the rig operation data, and wherein the artificial intelligence algorithm is selected from a group consisting of a decision tree algorithm, a support vector machine, an ensemble method, and a naive Bayes classifier algorithm.

17. The system of claim 13, wherein simulating the sequence of rig operations comprises determining an amount of risk for constructing the portion of the wellbore by the first drilling rig based on a simulation of the sequence of rig operations.

18. The system of claim 13, wherein the operations further comprise adjusting the operation of the equipment responsive to the control signal.

19. A non-transitory computer readable medium storing instructions executable by a computer processor, the instructions comprising functionality for:
obtaining geographic location data regarding of a desired geographic location for a first drilling rig;
obtaining rig operation data regarding a plurality of drilling rigs at different geographic locations;
performing one or more regression analyses on the rig operation data with a dependency on time, cost, or a combination thereof so as to filter the rig operation data and generate an estimated range of clean time, non-productive time, and cost;
generating, using the rig operation data, a model that identifies a level of risk associated with a plurality of rig operations;
determining a precision of the model based on a comparison of the estimated range of clean time and non-productive time with a measured clean time and a measured non-productive time, respectively;
simulating, by the computer processor and using the geographic location data and the model, a sequence of rig operations for constructing a portion of a wellbore drilled by the first drilling rig at the desired geographic location based at least in part on the model and the one or more regression analyses;
adjusting the model, using an artificial intelligence algorithm, based on a comparison of operation parameters of the model and the rig operation data;
generating a control signal to operate an equipment based at least in part on the results of the simulating, wherein operation of the equipment changes in response to receiving the control signal;

generating a risk proposal message that describes the probability that a drilling project will exceed a proposed bid based at least in part on a result of the simulating; and displaying the risk proposal message to an operator.

20. The non-transitory computer readable medium of claim 19, wherein the sequence of rig operations are simulated prior to construction of the wellbore at the desired geographic location, and wherein the sequence of rig operation comprises surface operations and downhole operations at the desired geographic location.

21. The non-transitory computer readable medium of claim 19, wherein simulating the sequence of rig operations comprises determining an amount of risk for constructing the portion of the wellbore by the first drilling rig based on a simulation of the sequence of rig operations.

* * * * *